United States Patent
Kelly et al.

(10) Patent No.: US 12,456,962 B2
(45) Date of Patent: Oct. 28, 2025

(54) TRANSVERSELY-EXCITED FILM BULK ACOUSTIC RESONATORS WAFER-LEVEL PACKAGING USING A DIELECTRIC COVER

(71) Applicant: Murata Manufacturing Co., Ltd., Nagaokakyo (JP)

(72) Inventors: Dylan Kelly, San Diego, CA (US); Andrew Guyette, San Mateo, CA (US); Patrick Turner, San Bruno, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 372 days.

(21) Appl. No.: 17/952,164

(22) Filed: Sep. 23, 2022

(65) Prior Publication Data
US 2023/0096387 A1    Mar. 30, 2023

Related U.S. Application Data

(60) Provisional application No. 63/247,910, filed on Sep. 24, 2021.

(51) Int. Cl.
*H03H 9/17*       (2006.01)
*H03H 3/02*       (2006.01)
(Continued)

(52) U.S. Cl.
CPC .............. *H03H 9/173* (2013.01); *H03H 3/02* (2013.01); *H03H 9/133* (2013.01); *H03H 9/568* (2013.01);
(Continued)

(58) Field of Classification Search
CPC .......... H03H 9/173; H03H 3/02; H03H 9/133; H03H 9/568; H03H 9/02157; H03H 2003/021; H03H 9/105; H03H 9/02228
(Continued)

(56) References Cited

U.S. PATENT DOCUMENTS 5,189,777 A    3/1993   Guckel et al.
5,204,575 A    4/1993   Kanda et al.
(Continued)

FOREIGN PATENT DOCUMENTS

CN    209017001 A    6/2019
CN    112787614 A    5/2021
(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Jorge L Salazar, Jr.
(74) *Attorney, Agent, or Firm* — ArentFox Schiff LLP

(57) ABSTRACT

An acoustic resonator device includes a substrate having a surface and a single-crystal piezoelectric plate bonded to the substrate surface. A portion of the piezoelectric plate forms a diaphragm that spans a cavity. A conductor pattern including an interdigital transducer (IDT) formed on a surface of the single-crystal piezoelectric plate such that interleaved fingers of the IDT are disposed on the diaphragm. A dielectric cover is disposed over the IDT and the plate, and the dielectric cover forms an air gap above the IDT and the plate.

20 Claims, 13 Drawing Sheets

©2022 RESONANT INC.

(51) Int. Cl.
*H03H 9/02* (2006.01)
*H03H 9/13* (2006.01)
*H03H 9/56* (2006.01)

(52) U.S. Cl.
CPC ... *H03H 2003/021* (2013.01); *H03H 9/02157* (2013.01)

(58) Field of Classification Search
USPC .............................. 333/187, 188, 193–196
See application file for complete search history.

(56) References Cited

U.S. PATENT DOCUMENTS

| | | | |
|---|---|---|---|
| 5,274,345 A | 12/1993 | Gau | |
| 5,446,330 A | 8/1995 | Eda et al. | |
| 5,552,655 A | 9/1996 | Stokes et al. | |
| 5,726,610 A | 3/1998 | Allen et al. | |
| 5,729,186 A | 3/1998 | Seki et al. | |
| 5,853,601 A | 12/1998 | Krishaswamy | |
| 5,952,899 A | 9/1999 | Kadota et al. | |
| 6,172,582 B1 | 1/2001 | Hickernell | |
| 6,271,617 B1 | 8/2001 | Yoneda et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 | 5/2003 | Maehara et al. | |
| 6,707,229 B1 | 3/2004 | Martin | |
| 6,710,514 B2 | 3/2004 | Ikada et al. | |
| 6,833,774 B2 | 12/2004 | Abbott et al. | |
| 7,009,468 B2 | 3/2006 | Kadota et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,148,121 B2 | 9/2015 | Inoue | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,389,332 B2 | 8/2019 | Bhattacharjee | |
| 10,476,469 B2 | 11/2019 | Gong et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 | 10/2020 | Nosaka | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,114,996 B2 | 9/2021 | Plesski et al. | |
| 11,114,998 B2 | 9/2021 | Garcia et al. | |
| 11,139,794 B2 | 10/2021 | Plesski et al. | |
| 11,143,561 B2 | 10/2021 | Plesski | |
| 11,146,231 B2 | 10/2021 | Plesski | |
| 11,146,232 B2 | 10/2021 | Yandrapalli et al. | |
| 11,146,238 B2 | 10/2021 | Hammond et al. | |
| 11,146,244 B2 | 10/2021 | Yantchev | |
| 11,165,407 B2 | 11/2021 | Yantchev | |
| 11,171,629 B2 | 11/2021 | Turner | |
| 11,201,601 B2 | 12/2021 | Yantchev et al. | |
| 11,206,009 B2 | 12/2021 | Plesski | |
| 11,228,296 B2 | 1/2022 | Dyer | |
| 11,239,816 B1 | 2/2022 | McHugh | |
| 11,239,822 B2 | 2/2022 | Garcia | |
| 11,264,966 B2 | 3/2022 | Yantchev | |
| 11,264,969 B1 | 3/2022 | Fenzi | |
| 11,271,539 B1 | 3/2022 | Yantchev | |
| 11,271,540 B1 | 3/2022 | Yantchev | |
| 11,283,424 B2 | 3/2022 | Turner | |
| 11,309,865 B1 | 4/2022 | Guyette | |
| 11,323,089 B2 | 5/2022 | Turner | |
| 11,323,090 B2 | 5/2022 | Garcia | |
| 11,323,091 B2 | 5/2022 | Kay | |
| 11,323,095 B2 | 5/2022 | Garcia | |
| 11,323,096 B2 | 5/2022 | Yantchev | |
| 11,349,450 B2 | 5/2022 | Yantchev | |
| 11,349,452 B2 | 5/2022 | Yantchev | |
| 11,356,077 B2 | 6/2022 | Garcia | |
| 11,368,139 B2 | 6/2022 | Garcia | |
| 11,374,549 B2 | 6/2022 | Yantchev | |
| 11,381,221 B2 | 7/2022 | McHugh | |
| 2002/0079986 A1 | 6/2002 | Ruby et al. | |
| 2002/0130736 A1 | 9/2002 | Mukai | |
| 2002/0153970 A1 | 10/2002 | Noto | |
| 2002/0158714 A1 | 10/2002 | Kaitila et al. | |
| 2002/0189062 A1 | 12/2002 | Lin et al. | |
| 2002/0190814 A1 | 12/2002 | Yamada et al. | |
| 2003/0042998 A1 | 3/2003 | Edmonson | |
| 2003/0080831 A1 | 5/2003 | Naumenko et al. | |
| 2003/0199105 A1 | 10/2003 | Kub et al. | |
| 2004/0041496 A1 | 3/2004 | Imai et al. | |
| 2004/0100164 A1 | 5/2004 | Murata | |
| 2004/0130410 A1 | 7/2004 | Nishimura et al. | |
| 2004/0140866 A1 | 7/2004 | Taniguchi | |
| 2004/0233020 A1 | 11/2004 | Nakamura | |
| 2004/0261250 A1 | 12/2004 | Kadota et al. | |
| 2005/0077982 A1 | 4/2005 | Funasaka | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0055485 A1 | 3/2006 | Lobeek | |
| 2006/0152107 A1 | 7/2006 | Tanaka | |
| 2006/0179642 A1 | 8/2006 | Kawamura | |
| 2007/0029679 A1 | 2/2007 | Selmeier et al. | |
| 2007/0030096 A1 | 2/2007 | Nichihara et al. | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0100397 A1 | 5/2008 | Nam et al. | |
| 2008/0246559 A1 | 10/2008 | Ayazi | |

(56) References Cited

U.S. PATENT DOCUMENTS

| | | |
|---|---|---|
| 2009/0114798 A1 | 5/2009 | Tigli et al. |
| 2010/0019866 A1 | 1/2010 | Hara et al. |
| 2010/0064492 A1 | 3/2010 | Tanaka |
| 2010/0117483 A1 | 5/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0300519 A1 | 11/2013 | Tamasaki et al. |
| 2013/0321100 A1 | 12/2013 | Wang |
| 2014/0009032 A1 | 1/2014 | Takahashi |
| 2014/0015624 A1 | 1/2014 | Kishino |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0340173 A1 | 11/2014 | Burgener et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2016/0261038 A1 | 9/2016 | Tanaka |
| 2017/0063332 A1 | 3/2017 | Gilbert et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0201235 A1 | 7/2017 | Freisleben |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2018/0369816 A1 | 12/2018 | Ai et al. |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0181832 A1 | 6/2019 | Schmalzl et al. |
| 2019/0190487 A1 | 6/2019 | Yasuda |
| 2019/0245509 A1 | 8/2019 | Hurwitz |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0028481 A1 | 1/2020 | Sun et al. |
| 2020/0028489 A1 | 1/2020 | Ta et al. |
| 2020/0036357 A1 | 1/2020 | Mimura |
| 2020/0083861 A1 | 3/2020 | Matsuo |
| 2020/0083862 A1 | 3/2020 | Makkonen et al. |
| 2020/0083863 A1 | 3/2020 | Makkonen et al. |
| 2020/0153412 A1 | 5/2020 | Nosaka |
| 2020/0177160 A1 | 6/2020 | Jachowski |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0328725 A1 | 10/2020 | Jo et al. |
| 2020/0350891 A1 | 11/2020 | Turner |
| 2021/0006229 A1 | 1/2021 | Yantchev |
| 2021/0013859 A1 | 1/2021 | Turner et al. |
| 2021/0013860 A1 | 1/2021 | Dyer et al. |
| 2021/0067138 A1 | 3/2021 | Yantchev |
| 2021/0091749 A1 | 3/2021 | Plesski et al. |
| 2021/0119595 A1 | 4/2021 | Turner et al. |
| 2021/0126624 A1 | 4/2021 | Hiramatsu et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |
| 2021/0399750 A1 | 12/2021 | Varela Campelo |
| 2022/0052669 A1* | 2/2022 | Schäufele ............ H03H 9/0542 |
| 2022/0067138 A1 | 3/2022 | Paert |

FOREIGN PATENT DOCUMENTS

| | | |
|---|---|---|
| CN | 113839643 A | 12/2021 |
| GB | 2578958 A | 6/2020 |
| JP | 2020155967 A | 9/2020 |
| WO | 2016017104 | 2/2016 |
| WO | 2018003273 | 1/2018 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 00, 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

(56) References Cited

OTHER PUBLICATIONS

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).
Material Properties of Tibtech Innovations, © 2018 TIBTECH Innovations (Year 2018). 2018.
Merriam Webster, dictionary meaning of the word "diaphragm", since 1828, Merriam Webster (Year: 1828) 1828.
Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.
Moussa et al. Review on Triggered Liposomal Drug Delivery with a Focus on Ultrasound 2015, Bentham Science Publishers, pp. 16 (Year 2005) 2005.
Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.
Naumenko et al., "Optimal orientations of Lithium Niobate for resonator SAW filters", 2003 IEEE Ultrasonics Symposium—pp. 2110-2113. (Year: 2003).
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
Reinhardt, "Acoustic filters based on thin single crystal LiNbQ,3 films: status and prospects", 2014 IEEE International Ultrasonics Symposium Proceedings, pp. 773-781 (Year: 2014).
Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.
Safari et al. "Piezoelectric for Transducer Applications" published by Elsevier Science Ltd., pp. 4 (Year: 2000). 2020.
Santosh, G. , Surface acoustic wave devices on silicon using patterned and thin film ZnO, Ph.D. thesis, Feb. 2016, Indian Institute of technology Guwahati, Assam, India Feb. 2016.
Sinha et al., "Slanted finger Inter-digital Transducers for the design of improved performance small shape factor mid-bandwidth SAW filters", IEEE MTT-S International Microwave and RF Conference, 2013. (Year: 2013).
Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 00, 2015.
T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
USPTO/ISA, International Search Report and Written Opinion for PCT Application No. PCT/US2020/45654 dated Oct. 29, 2020.
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
USPTO/ISA, International Search Report and Written Opinion for PCT Application No. PCT/US2022/022908, mail date Jul. 19, 2022.
USPTO/ISA, International Search Report and Written Opinion for PCT Application No. PCT/US2022/028378, mail date Aug. 19, 2022.
USPTO/ISA, International Search Report and Written Opinion for PCT Application No. PCT/US22/21206, mail date Jul. 7, 2022.
USPTO/ISA, International Search Report and Written Opinion for PCT Application No. PCT/US22/22632, mail date Jul. 19, 2022.
World Intellectual Property Organization, International Search Report and Written Opinion for International Application No. PCT/US2022/027796, mail date Aug. 17, 2022, 12 total pages. Aug. 17, 2022.
World Intellectual Property Organization, International Search Report and Written Opinion for International Application No. PCT/US2022/027798, mail date Sep. 6, 2022, 8 total pages. Sep. 6, 2022.
Wu et al., "Frequency band-gap measurement of two-dimensional air/silicon phononic crystals using layered slanted finger interdigital transducers", J. Appl. Phys. 97, 094916, 2005 (Year: 2005).
Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Zou, Jie "High-Performance Aluminum Nitride Lamb Wave Resonators for RF Front-End Technology" University of California, Berkeley, Summer 2015, pp. 63 (Year 2015) Jan. 00, 2015.

* cited by examiner

TRANSVERSELY-EXCITED FILM BULK ACOUSTIC RESONATORS WAFER-LEVEL PACKAGING USING A DIELECTRIC COVER A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority to co-pending U.S. provisional patent application No. 63/247,910, filed Sep. 24, 2021, entitled XBAR WAFER-LEVEL PACKAGING.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of or having a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
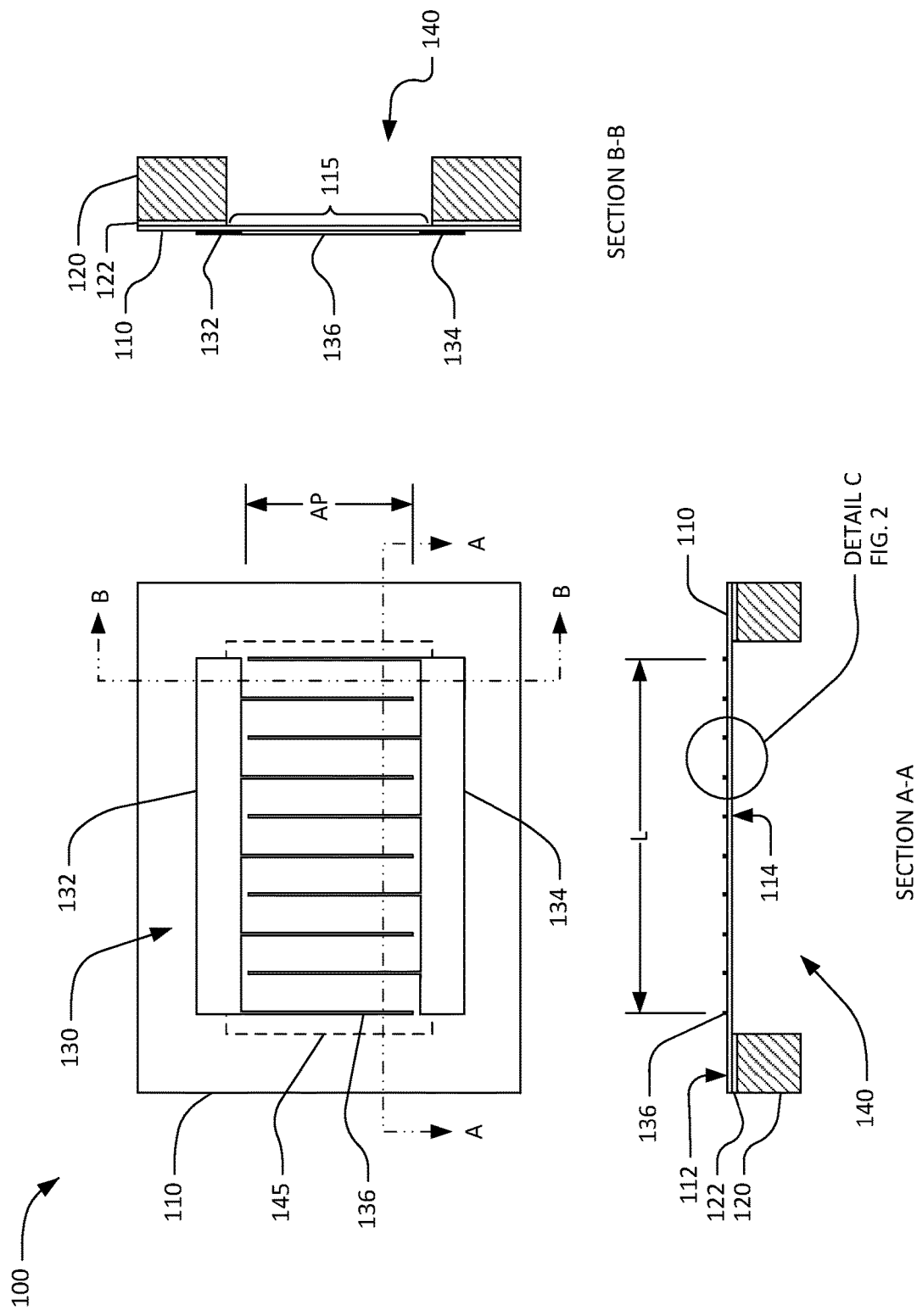
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

A piezoelectric membrane may be a part of a plate of single-crystal piezoelectric material that spans a cavity in the substrate. A piezoelectric diaphragm may be the membrane and may include front-side and/or back-side dielectric layers. An XBAR resonator may be such a diaphragm or membrane with an interdigital transducer (IDT) formed on a diaphragm or membrane.

The following describes improved XBAR resonators, filters and fabrication techniques for XBAR resonators with wafer-level packaging (WLP) using a dielectric cover. The dielectric cover may be glass (preferably), fused silica, quartz, sapphire, or some other non-conductive material. This alternative WLP technique uses a dielectric cover or lid that is wafer bonded to the device wafer during WLP to form acoustic RF filters having XBARs. The dielectric cover or lid improves RF performance, including by reducing distortion of the filter characteristics and reducing loss (e.g., increasing gain) otherwise caused by the silicon cover. Using dielectric as a cover reduces the capacitive coupling across the acoustic resonators of a filter that is caused by another type of cover (e.g., a silicon cover), thus improving the bandwidth.

Using dielectric as a cover reduces the loss associated with Silicon, another semiconductor or a conductor as a cover. Silicon is a semiconductor while a dielectric is a non-conductive material. Even intrinsic silicon may form a resistive surface inversion layer under the influence of the electric fields generated by the IDTs of an XBAR filter. Current flowing in the silicon cover and or the inversion layer contributes to the insertion loss of the filter. Using a dielectric (i.e. non-conductive) cover eliminates this source of undesired loss.

Wafer-level packaging (WLP) is a process where packaging components are attached to an integrated circuit (IC) before the device wafer—on which the IC and other ICs are fabricated—is diced to separate the ICs from each other. In WSP, the top and bottom layers of the packaging and the solder bumps are attached to the integrated circuits while they are still in the device wafer. This process differs from a conventional process, in which the wafer is sliced into individual circuits (dice) or ICs before the packaging components are attached to each IC.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide (BOX) layer or an intermediate layer 122, such as a layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". It is possible for a bonding oxide layer (BOX) or intermediate layer 122 to bond the plate 110 to the substrate 120. The BOX or layer 122 layer may exist between the plate and substrate around perimeter 145 and may extend further away from the cavity than just within the perimeter itself. In the absence of a process to remove it (i.e., this invention) the BOX or intermediate layer 122 is everywhere between the piezoelectric plate and the substrate. The BOX or intermediate layer 122 may be removed from the back of the diaphragm 115 as part of forming the cavity, such as during or after backside etching the cavity 140 from the back side of the substrate. In some cases, a substrate of a device wafer may include the BOX or intermediate layer 122 and substrate 120.

The conductor pattern of the XBAR 100 includes a conductor patter having an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
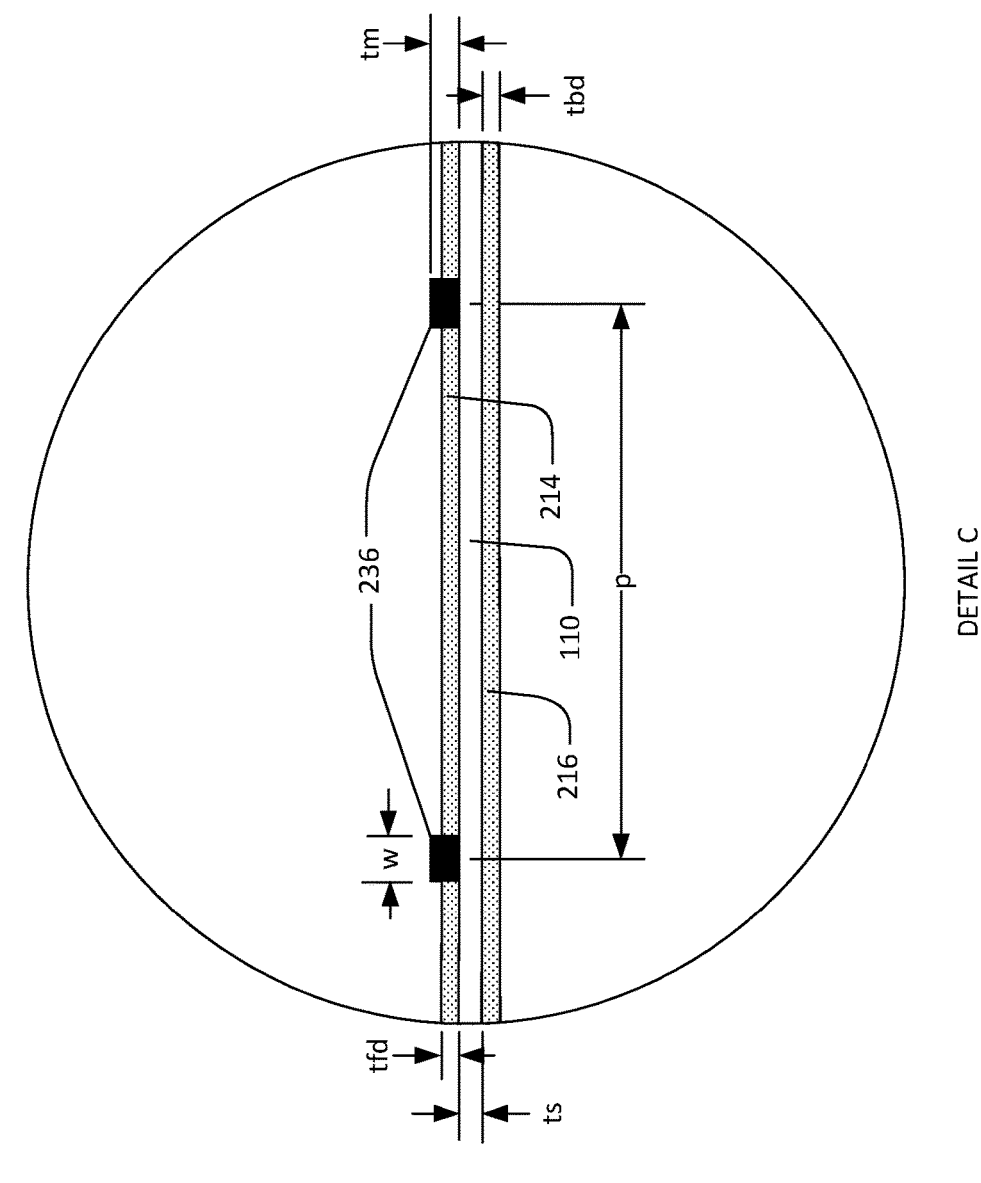
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness is of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and $Si_3N_4$ material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. If the center-to-center spacing of the IDT fingers varies along the length of the IDT, the "pitch" is the average of the center-to-center spacing of all pairs of adjacent fingers. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The pitch p may be between 3 um and 8 um. The pitch p may be between 4 um and 5 um. The plate thickness tm may be between 300 nm and 500 nm. The plate thickness tm may be 400 nm. The finger width w may be between 0.5 um and 7.5 um. The finger width w may be 1 um. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
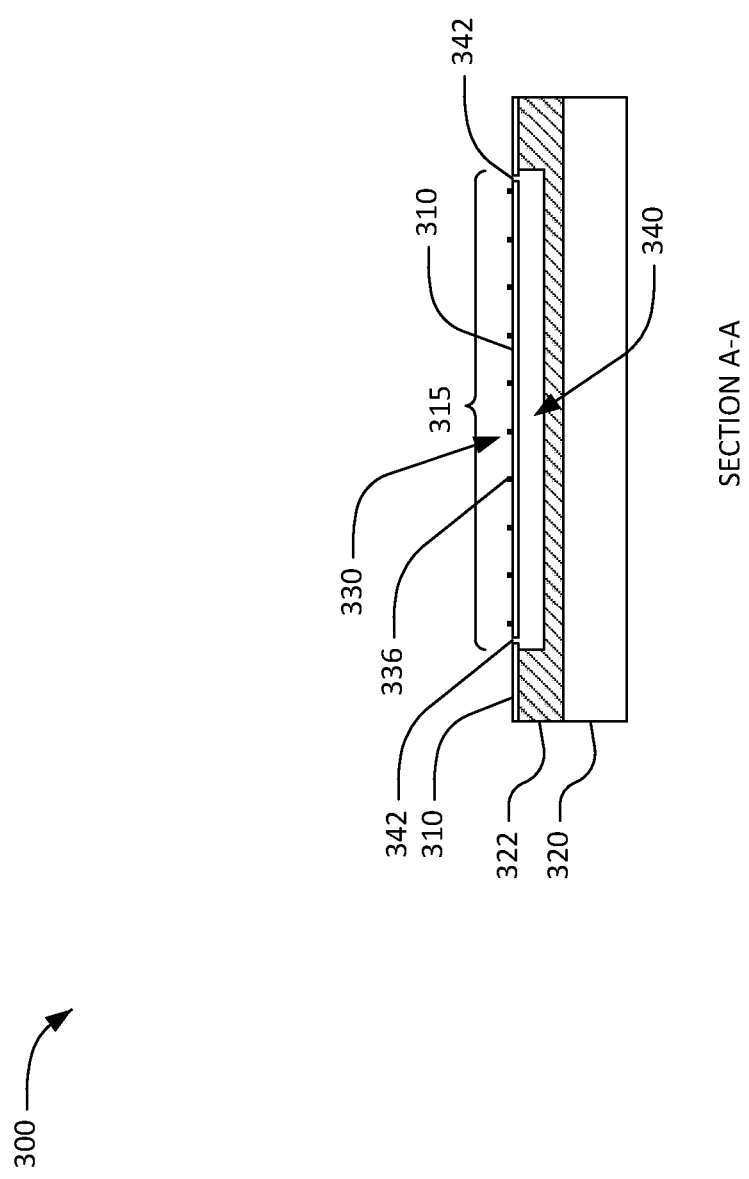
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to an intermediate layer 322 of a substrate 320. A portion of the piezoelectric plate 310 forms a diaphragm 315 spanning a cavity 340 in the substrate. The cavity 340, does not fully penetrate the intermediate layer 322, and is formed in the layer 322 under the portion of the piezoelectric plate 310 containing the IDT 330 of a conductor pattern (e.g., first metal or M1 layer) of an XBAR. Fingers, such as finger 336, of an IDT are disposed on the diaphragm 315. Interconnection of the IDT (e.g., busbars) 330 to signal and ground paths may be through a second conductor pattern (e.g., an M2 metal layer, not shown in FIGS. 1-3A) to other conductor patterns and/or to electrical contacts on a package.

Plate 310, diaphragm 315 and fingers 336 may be plate 110, diaphragm 115 and fingers 136 (or 236). The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

Intermediate layer 322 may be one or more intermediate material layers attached between plate 310 and substrate 320. An intermediary layer may be or include a bonding layer, a BOX layer, an etch stop layer, a sealing layer, an adhesive layer or layer of other material that is attached or bonded to plate 310 and substrate 320. A layer of layers 322 may be a dielectric, an oxide, a silicon oxide, silicon nitride, an aluminum oxide, silicon dioxide or silicon nitride. Layers 322 may be one or more of any of these layers or a combination of these layers.

While the cavity 340 is shown in cross-section, it should be understood that the lateral extent of the cavity is a continuous closed band area of layer 322 that surrounds and defines the size of the cavity 340 in the direction normal to the plane of the drawing. The lateral (i.e. left-right as shown in the figure) extent of the cavity 340 is defined by the lateral edges layer 322. The vertical (i.e. down from plate 310 as shown in the figure) extent or depth of the cavity 340 into layer 322. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the layer 322 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

In some cases, the substrate comprises a base substrate 320 and an intermediate layer (not shown) to reinforce an intermediate bonding oxide (BOX) layer. Here, the first intermediate layer may be considered a part of the substrate base 320.

In some cases, layer 322 does not exist and the plate is bonded directly to the substrate 320; and the cavity is formed in and etched into the substrate 320.

In some cases, although not shown in the figure, layer 322 is a thinner layer than the depth of the cavity such that the plate is bonded directly to layer 322; and the cavity is formed in and etched into the layer 322 and into the substrate 320. Here, the cavity extends completely through layer 322 and has a cavity bottom in the substrate 320.

Figure 3B:
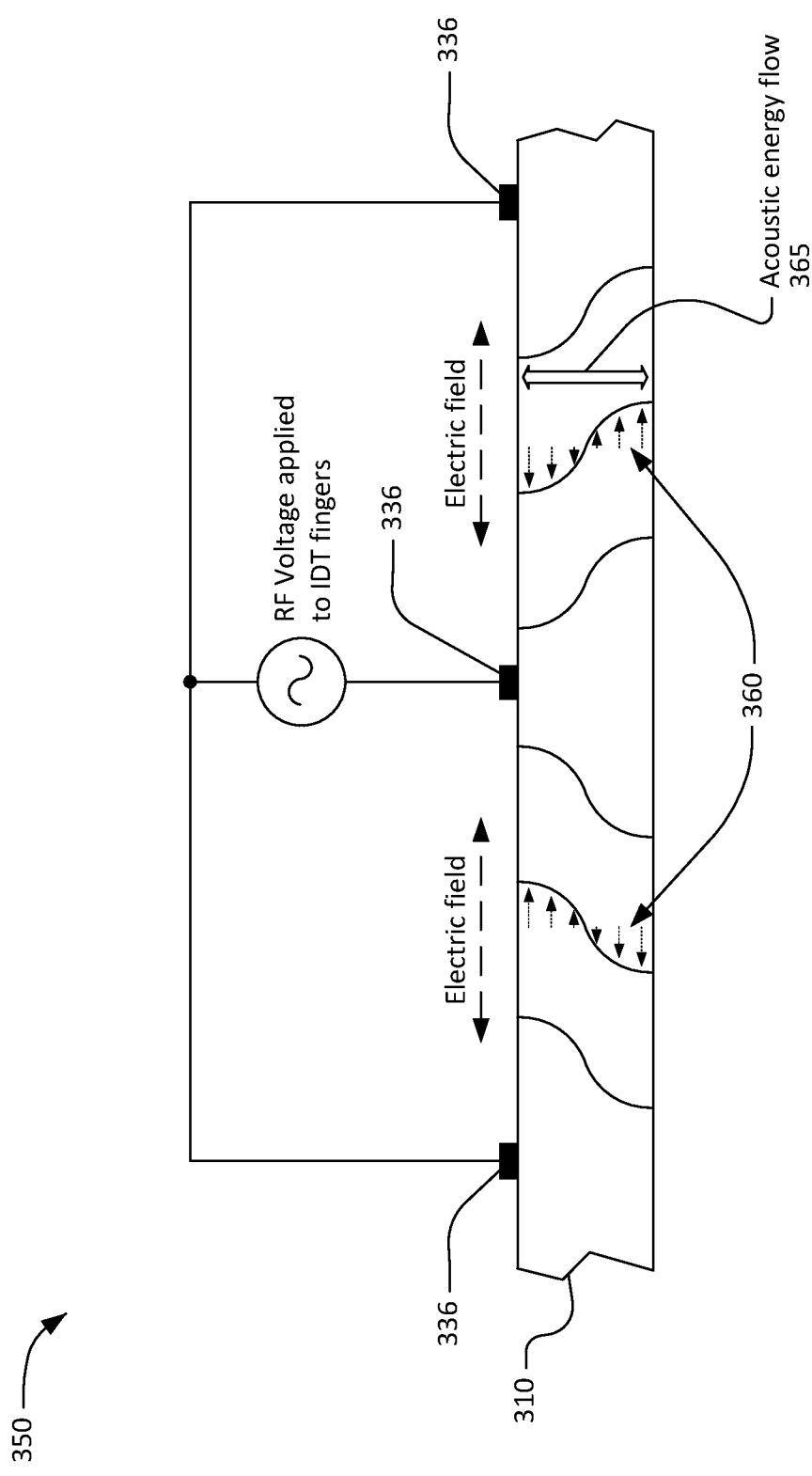
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
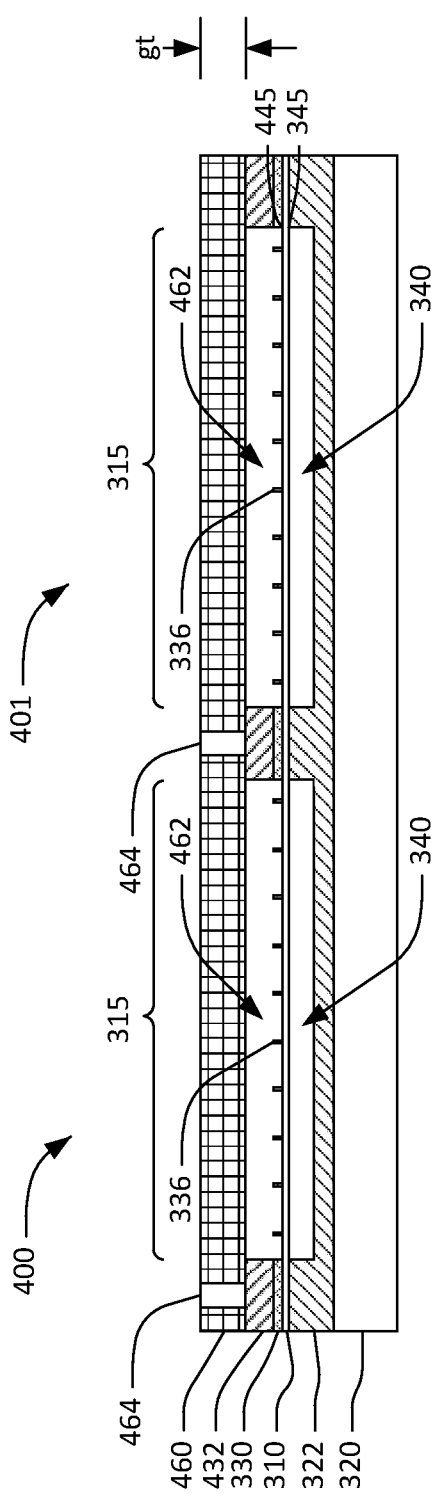
FIG. 4A shows a simplified schematic cross-sectional view of XBARs with wafer-level packaging (WLP) using a dielectric cover.

FIG. 4A shows a simplified schematic cross-sectional view of an XBAR 400 and an XBAR 401, each with wafer-level packaging (WLP) using a dielectric cover 460. Device 400 and 401 may each represent a version of device 100, 300 and/or 350 and with wafer-level packaging (WLP) using a dielectric cover 460.

XBARs 400 and 401 are acoustic resonator devices having substrate 320 with intermediate layer 322 and a single-crystal piezoelectric plate 310 bonded to the top surface of the layer 322 of the substrate. A portion of the piezoelectric plate forms diaphragms 315 that spans cavities 340 in the layer 322. Layer 322 may be considered part of a substrate of XBARs 400 and 401. A conductor pattern or metal 1 (e.g., M1) layer includes IDTs 310 formed on a surface of the single-crystal piezoelectric plate 310 such that interleaved fingers 336 of the IDTs are disposed on the diaphragms 315.

The IDTs 330 includes a first set of the interleaved fingers attached to and extending from a first busbar, and a second set of the interleaved fingers attached to and extending from a second busbar such as noted in FIG. 1. The conductor pattern includes at least one second metal (e.g., M2) layer 432 formed on the IDTs, which may be formed on at least the first and second busbars. Layer 432 can represent a second, third and fourth metal layer. It can represent fewer than 3 or up to 7 metal layers. In some cases, Layer 432 represents a number of layers that include metal and other material layers, such as dielectric layers with through conductive vias or other electrical connections.

Dielectric cover 460 is disposed over the IDTs 330 and over the plate 310. Cover 460 forms air gaps 462 above the IDTs and the plate. Gap 462 can be filled with a gas other than air. The air gap 462 is formed between a bottom surface of the dielectric cover 460, side surfaces of the second metal layer 432 and a top surface of the plate 310.

The dielectric cover may be a packaging lid that is bonded to the second metal layer 432, such as to the top surface of layer 432. Dielectric cover 460 may form a top of the devices 400 and 401. Cover 460 may have a bottom surface that is wafer bonded to the conductor pattern or layer 432 and has an exposed top surface.

The diaphragms 315 and/or cavities 340 have perimeter 345 below the plate 310. The diaphragms 315 and/or air gaps 462 have air gap perimeter 445 above the plate 310. Perimeter 445 may be the same area of the plate 310 as perimeter 345. In other cases, the perimeters are not the same area, such as where perimeter 445 is larger or smaller than perimeter 345. Perimeter 445 may be larger than perimeter 345 such as when the device does not have the central part of layer 432 shown in the figure. In this case, there may be a single gap 462 above both XBARs 400 and 401.

XBARs 400 and 401 each have electrical contact vias formed through the dielectric cover 460 and conductive material in the vias to form through wafer vias (TWVs) 464. TWVs 464 and the conductive material in the vias may electrically connect the IDTs 330 to contact pads (not shown) on cover 460 for connecting to external devices. The pads and vias may receive input signals for and provide output signals from the XBARs. They may also conduct ground signals to the XBARs.

A radio frequency (RF) signal applied to the IDTs 330 excites a primary shear acoustic mode in the piezoelectric plate 310 over the cavities 340. The RF signal may be received though one or more of vias 464.

Figure 5:
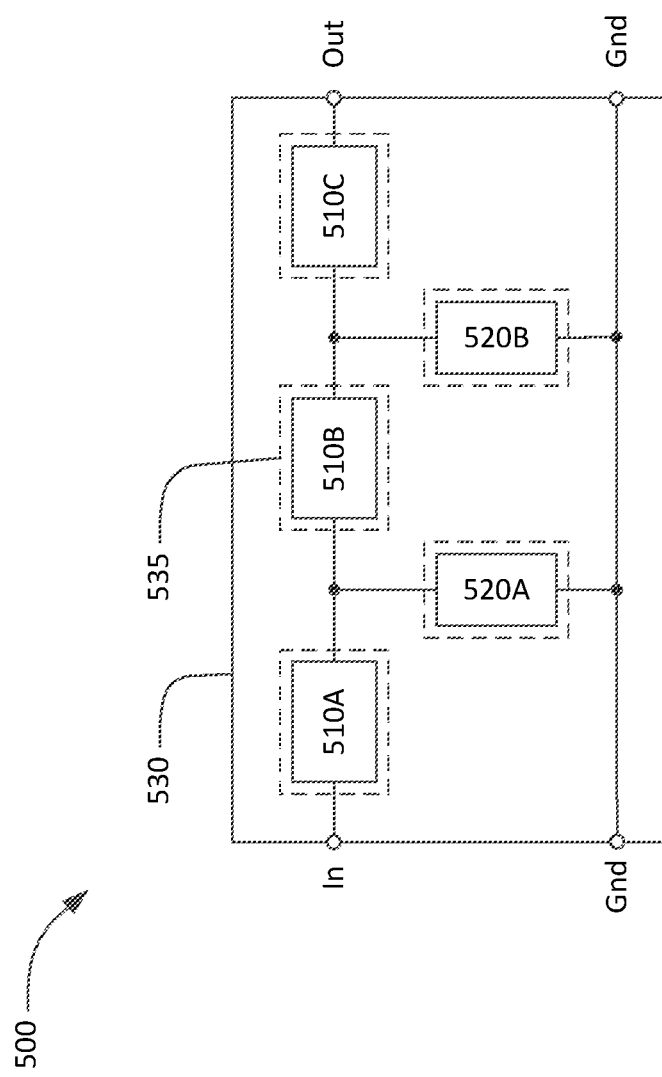
FIG. 5 is a schematic block diagram of a filter using XBARs.

XBARs 400 and 401 may be part of a radio frequency filter such as filter 500 of FIG. 5. Each may be a series or a shunt resonator. Plate 310 may be a separate plate for or have a different thickness for each XBAR. One of the XBARs may have a frontside dielectric. In other cases, both XBARs have a frontside dielectric. These dielectrics may have a different thickness.

Substrate 320 may have thickness of between 50 um and 200 um. The thickness may be 100 um. Layer 322 may have thickness of between 1 um and 5 um. The thickness may be between 1.5 um and 2.5 um. Plate 310 may have thickness of between 50 um and 1000 nm. The thickness may be between 100 nm and 500 nm. The combination of layers 130 and 432 may have thickness of between 4 um and 12 um. The thickness may be 8 um.

The dielectric cover 460 has a height or thickness gt of between 40 um and 80 um. The thickness gt may be between 50 um and 70 um. The thickness may be 60 um. Thickness gt may be between 12 percent and 60 percent of a thickness of the plate.

Cover 460 may be made of Quartz. Cover 460 may be made of glass, fused silica glass, quartz, alumina, sapphire, or some other non-conductive material. It may be made of another type of glass. It may be from a wafer of this material that is bonded to a device wafer having XBARs 400 and 401 before dicing these XBARs or the filter they are part of.

Dielectric cover 460 may have material properties: an Er=3.78, and have a loss tangent of 0.0001. Er is relative dielectric coefficient. Both Er and loss tangent are frequency dependent.

As compared to a cover of silicon, cover 460 reduces the capacitive coupling across the XBARs 400 and 401 when the RF signal is received by the XBARs, such as during use of the filter as a radio receiver and/or transmitter. During use of the filter, cover 460 reduces the capacitive coupling between XBARs 400 and 401.

The dielectric cover 460 may reduce capacitive coupling between each XBARs 400 and 401; and between all other resonators of a filter, such as all other resonators of filter 500. The dielectric cover 460 may reduce charges on a surface of the dielectric cover that act as a resistive layer, such as a layer providing an electrical connection having a resistance between the XBARs 400 and 401. Thickness gt may be selected based on reducing this capacitive coupling, and/or reducing these charges.

Cover 460 may be a package bottom or backside of a filter having the XBARs (e.g., see filter 500 of FIG. 5) having a lid surface with the lid backside-package contact pads. Cover 460 may be part of a wafer-level package for the XBARs 400 and 401; and/or all XBARs of the filter. XBARs 400 and 401 may be formed by XBAR wafer-level packaging using a dielectric cover 460.

The filter may be fabricated by forming XBARs 400 and 401 on a surface of a device wafer having substrate 320. A wafer having dielectric cover 460 is then bonded over the surface of the device wafer having the XBARs to form a laminate. The laminate (and substrate 320) is then diced to provide individual filters, such as individual filters 500 each having XBARs including the XBARs 400 and 401.

Multiple ones of filters 500 may be packaged using wafer-level packaging (WLP) in which a wafer having multiple covers 460 is wafer bonded over the entire device wafer having the multiple filters 500. Then, each of the filters 500 is separated as a chips from the bonded wafer. The individual packaged filter devices may be excised by dicing using a saw or some other method to individualize each chip. In some cases, the excised chips may have multiple ones of filters 500 and each of those filters may have a different passband.

Figure 4B:
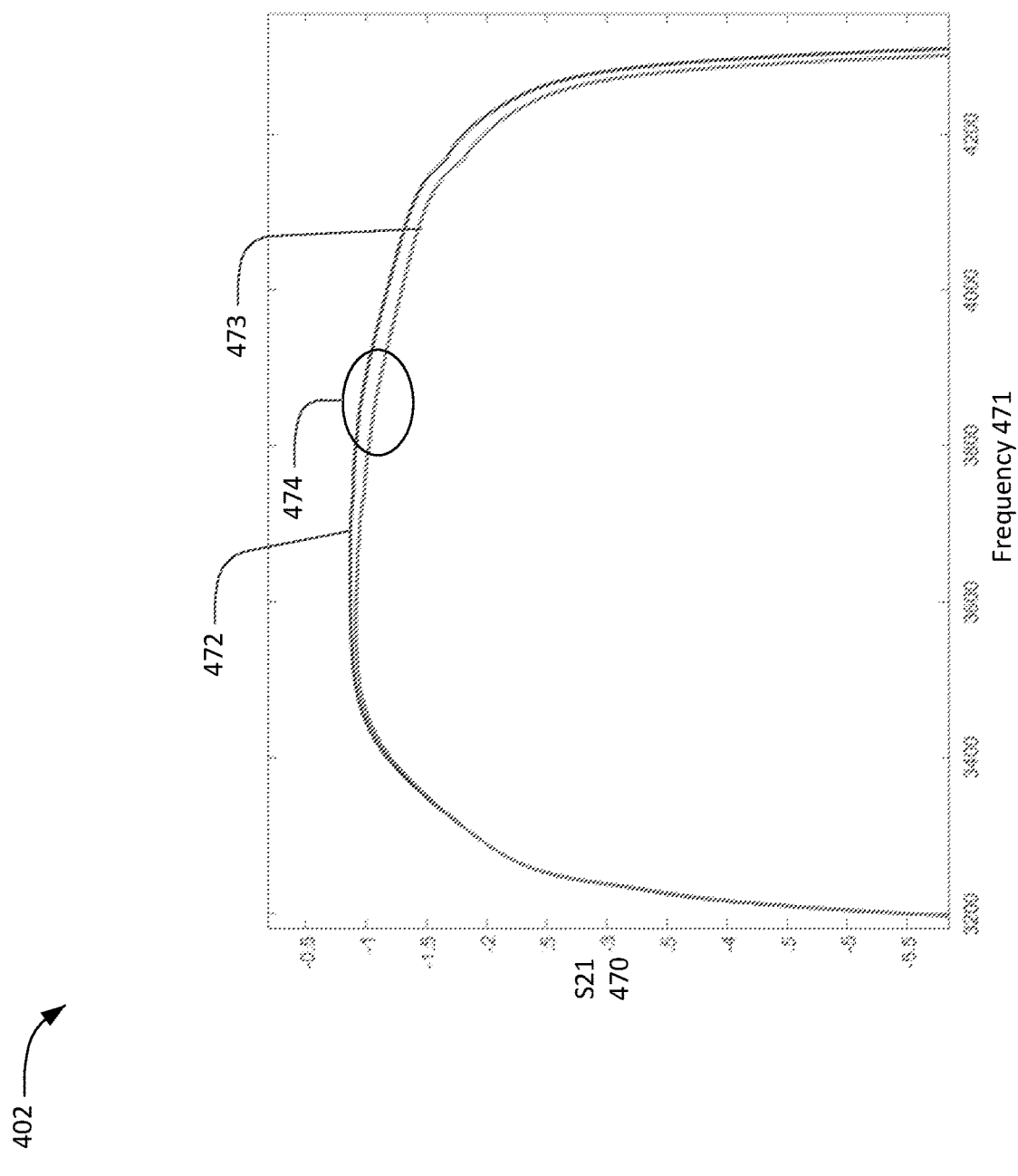
FIG. 4B is a chart of the magnitude of insertion loss (IL) of two 1-die, 6 XBAR resonator filter devices as functions of frequency.

FIG. 4B is a chart 402 of the magnitude of S21, the input-output transfer function, of two 1-die, 6 XBAR resonator filter devices as functions of frequency. Chart 402 shows the normalized magnitude of S21 470 (on a logarithmic scale) as a function of frequency 471 for two XBAR devices simulated using finite element method (FEM) simulation techniques. The line 473 is a plot of the IL of an XBAR with wafer-level packaging (WLP) using a silicon cover instead of dielectric cover 460. This silicon cover may have material properties: Er=11.9, and Bulk conductivity=0.2 siemens/m (volume resistivity=500 Ohm-cm). The line 472 is a plot of the IL of an XBAR with WLP using a dielectric cover 460. Line 472 may be for a version of device 400; or a version of device 100, 300 or 350 and with wafer-level packaging (WLP) using a dielectric cover 460. In this case, cover 460 may be quartz glass, and have material properties: Er=3.78, and loss tangent=0.0001. The height or thickness of the silicon cover and of cover 460 is 60 um. As shown in oval 474, using cover 460 causes a moderate and desirable improvement in IL of about 0.2 dB (e.g., −0.2 dB lower loss) as compared to using the silicon cover.

Figure 4C:
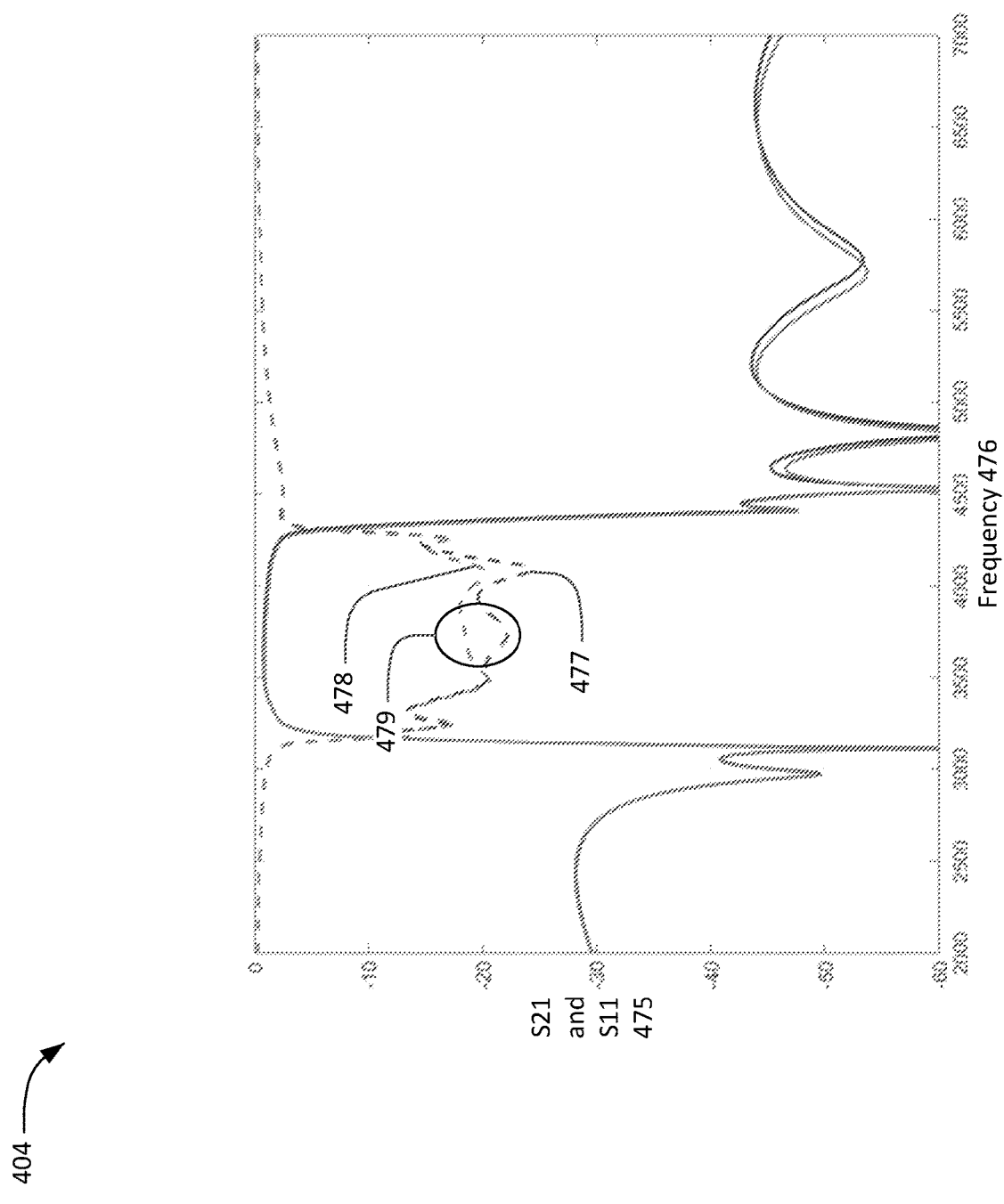
FIG. 4C is a chart of the magnitude of resistance (RL) of two 1-die, 6 XBAR resonator filter devices as functions of frequency.

FIG. 4C is a chart 404 of the magnitude of S21 and S11 (the input reflection coefficient in dB) of the two 1-die, 6 XBAR resonator filter devices of FIG. 4B as functions of frequency. In chart 404, the solid lines are S21 are the same as FIG. 4B but with expanded scales in FIG. 4C. In chart 404, the dashed lines are S11. Chart 404 shows the normalized magnitude of the S11 475 (on a logarithmic scale) as a function of frequency 476 for the two XBAR devices simulated using FEM simulation techniques. The line 478 is a plot of the RL of the XBAR with WLP using a non-trap rich silicon cover from chart 402. The line 477 is a plot of the admittance on the XBAR with WLP using a dielectric cover 460 from chart 402. As shown in oval 479, using cover 460 causes a moderate and desirable improvement in center-band RL of about 3 dB as compared to using the silicon cover.

Figure 4D:
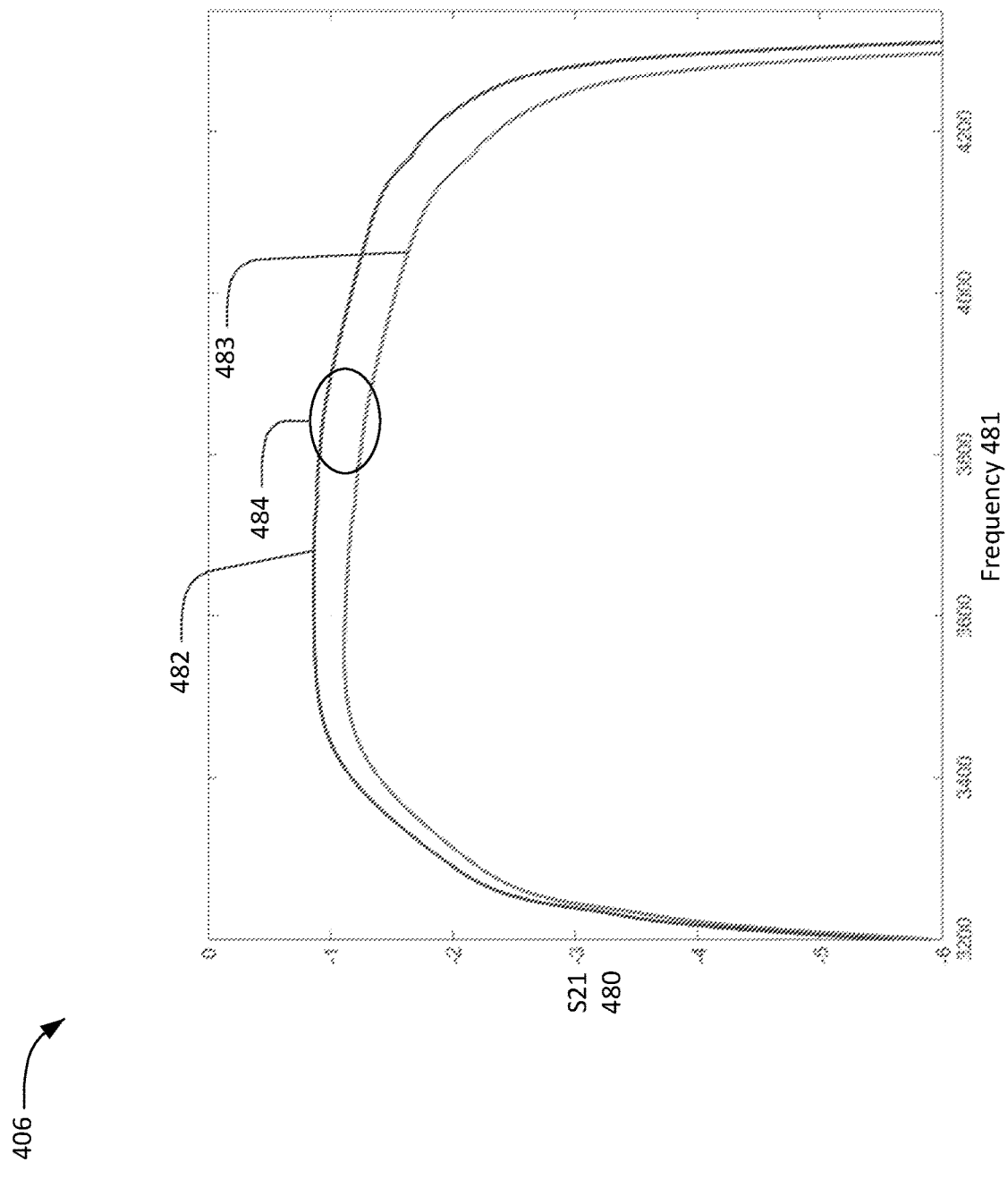
FIG. 4D is a chart of the magnitude of insertion loss (IL) of two 1-die, 6 XBAR resonator filter devices as functions of frequency.

FIG. 4D is a chart 406 of the magnitude of S21 of two 1-die, 6 XBAR resonator filter devices as functions of frequency. Chart 406 shows the normalized magnitude of the IL 480 (on a logarithmic scale) as a function of frequency 481 for two XBAR devices simulated using FEM simulation techniques. The line 483 is a plot of the IL of an XBAR with WLP using a non-trap rich silicon cover instead of dielectric cover 480. This silicon cover may have material properties: Er=11.9, and Bulk conductivity=1.0 siemens/m (volume resistivity=100 Ohm-cm). The line 482 is a plot of the IL of an XBAR with WLP using a dielectric cover 460 of graph 402. The height or thickness of the silicon cover and of cover 460 is 60 um. As shown in oval 484, using cover 460 causes a desirable improvement in IL of about 0.5 dB (e.g., −0.5 dB lower loss) as compared to using the silicon cover.

FIG. 5 is a schematic circuit diagram and layout for a high frequency band-pass filter 500 using XBARs where the two connections to an XBAR that are shown are connections to the two busbars of the XBAR. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). Any number of the resonators of filter 500 may be a version of XBAR 400 and 401; or a version of device 100, 300 or 350 and with wafer-level packaging (WLP) using a dielectric cover 460. In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Description of Methods

Figure 6A:
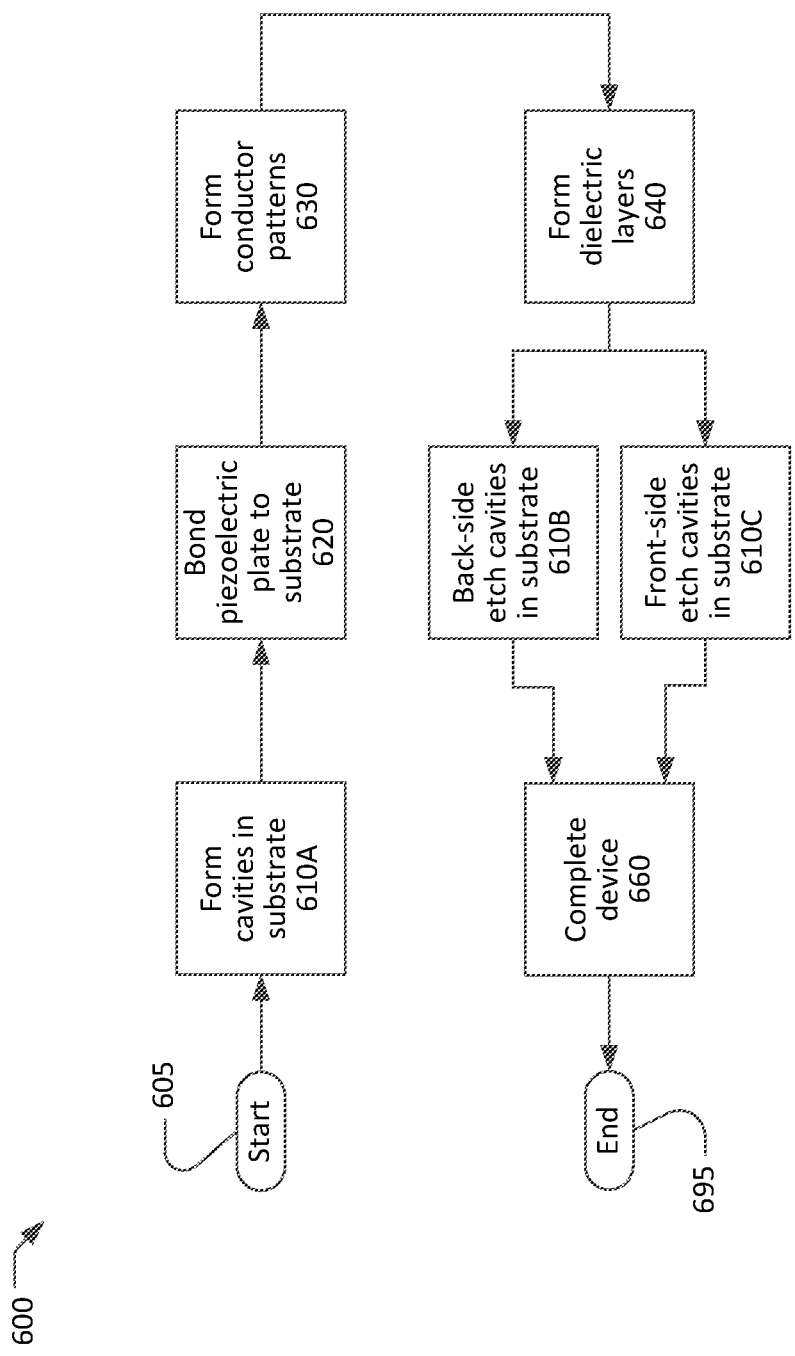
FIG. 6A is a flow chart of a process for fabricating an XBAR with wafer-level packaging (WLP) using a dielectric cover.

FIG. 6A is a simplified flow chart showing a process 600 for making an XBAR or a filter incorporating XBARs. The process 600 may form XBAR 400, XBAR 450 or an example of that XBAR. The process 600 starts at 605 with a substrate and a plate of piezoelectric material and ends at 695 with a completed XBAR or filter. As will be described subsequently, the piezoelectric plate may be mounted on a sacrificial substrate or may be a portion of wafer of piezoelectric material. The flow chart of FIG. 6A includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6A.

The flow chart of FIG. 6A captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. The substrate may be silicon. The substrate or an intermediary layer of the substrate may be some material that allows formation of deep cavities by etching or other processing. The silicon substrate may have layers of silicon TOX and polycrystalline silicon.

In one variation of the process 600, at 610A one or more cavities are formed in the substrate 120 or 320; or an intermediary layer of the substrate, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 322, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6A). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate or top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695.

FIGS. 1-4A may show examples of the fingers of selected IDTs after completion at 660.

Figure 6B:
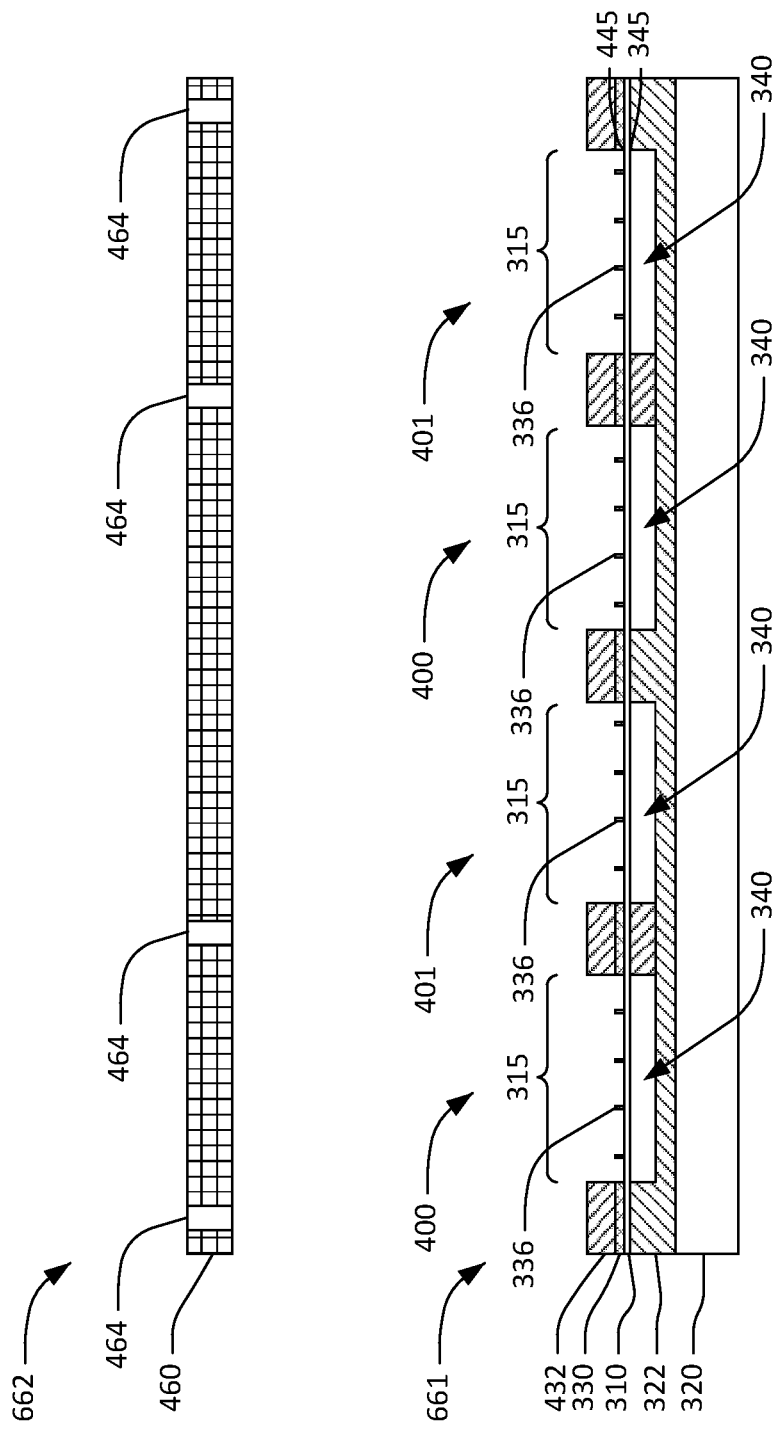
FIG. 6B is a schematic cross-sectional view of part of the process of FIG. 6A.

Process 600 and/or step 660 may include fabricating an XBAR with wafer-level packaging (WLP) using a dielectric cover. For example, as shown in FIG. 6B, steps 605 through 660 may include forming multiple filters by forming multiple XBARs 400 and 401 on a surface of a device wafer 661 having substrate 320. At step 660, a wafer 662 having dielectric cover 460 is formed, and optionally, vias 464 are formed in the wafer 662. The vias may also be formed after FIG. 6C or 6D.

Figure 6C:
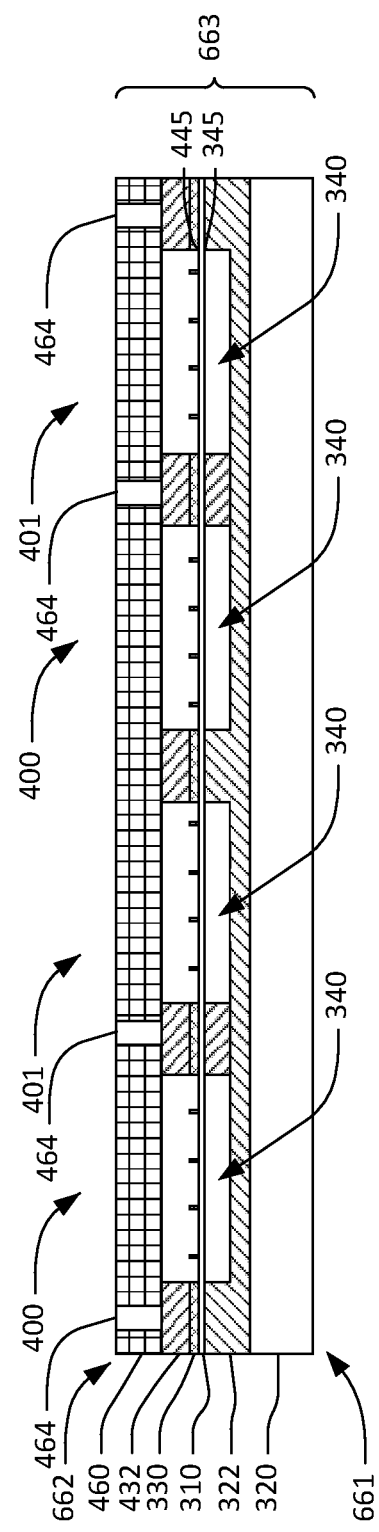
FIG. 6C is a schematic cross-sectional view of part of the process of FIG. 6A.

As shown in FIG. 6C, step 660 may include WLP of wafer 661 by wafer bonding the wafer 662 having dielectric cover 460 over the surface of the device wafer 661 having the XBARs to form a laminate 663 of the two wafers bonded together.

At FIG. 6C, multiple ones of filters 500 may be packaged using wafer-level packaging (WLP) in which a cover wafer 662 having multiple covers 460 is wafer bonded over the entire device wafer 661 having the multiple filters 500.

Figure 6D:
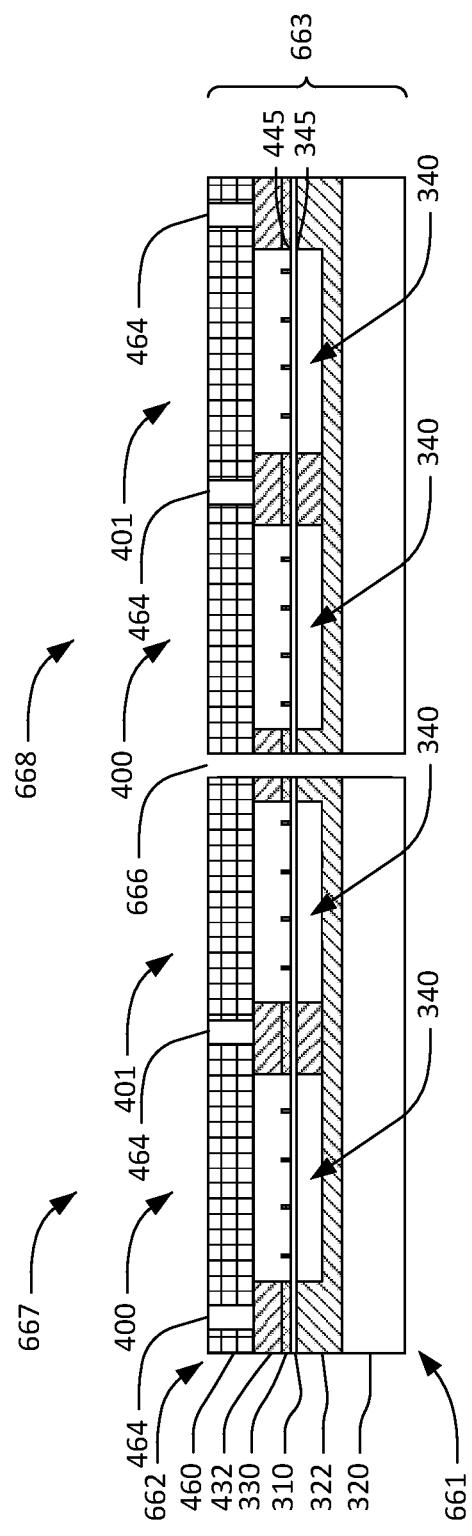
FIG. 6D is a schematic cross-sectional view of part of the process of FIG. 6A.

As shown in FIG. 6D, step 660 the laminate 663 (and substrate 320; and wafers 661 and 662) is then diced at dicing lane 666 to provide individual filters each having a set of XBARS 400 and 401, such as individual filters 500 each having XBARs including the XBARs 400 and 401. The individual filters may be on individual chips 667 and 668.

At FIG. 6D, each of the filters 500 is separated as a chip 667 and 668 from or of the bonded wafer 663. The individual packaged filter devices may be excised by dicing using a saw or some other method to individualize each chip 667 and 668.

In some cases, the excised chips may have multiple ones of filters 500 and each of those filters may have a different passband. The passbands may be contiguous passbands such that the bandwidth of multiple filters 500 is equal to the sum of the bandwidths of the constituent filters. Each of the multiple filters 500 may have non-contiguous passband separated from the passband of all of the other filters by a stop band that exists where the input-output transfer function of the matrix filter is less than −20 dB.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a piezoelectric layer attached to the surface of the substrate via an intermediate layer, the piezoelectric layer including a portion that forms a diaphragm that is over a cavity;
   a conductor pattern including an interdigital transducer (IDT) on a surface of the piezoelectric layer and having interleaved fingers on the diaphragm; and
   a dielectric cover over the IDT and the piezoelectric layer, the dielectric cover including a bottom surface attached to a portion of the conductor pattern, wherein the conductor pattern includes at least one metal layer, and wherein the dielectric cover is attached to the at least one metal layer,
   wherein the dielectric cover forms an air gap above the IDT and the piezoelectric layer.

2. The acoustic resonator device of claim 1, further comprising one or more contact vias that include a conductive material and that extend through the dielectric cover.

3. The acoustic resonator device of claim 2, wherein the conductive material in the contact vias electrically connects the IDT to external devices.

4. The acoustic resonator device of claim 1, wherein the conductor pattern comprises a plurality of metal layers including the at least one metal layer, wherein the IDT comprises a first set of metal layers and the at least one metal layer electrically connects the IDT to vias in the dielectric cover.

5. The acoustic resonator device of claim 4, wherein the at least one metal layer is thicker than the set of metal layers of the IDT.

6. The acoustic resonator device of claim 1, wherein the air gap is between the bottom surface of the dielectric cover, side surfaces of the at least one metal layer and a top surface of the piezoelectric layer.

7. The acoustic resonator device of claim 1, wherein:
   the IDT includes a first set of the interleaved fingers attached to and extending from a first busbar, and a second set of the interleaved fingers attached to and extending from a second busbar; and
   the conductor pattern includes the at least one metal layer on the first and second busbars.

8. The acoustic resonator device of claim 1, wherein the dielectric cover has a height that is between 40 micrometers (μm) and 80 μm.

9. The acoustic resonator device of claim 1, wherein a radio frequency signal applied to the IDT excites a primarily shear acoustic mode in the diaphragm, such that acoustic energy propagates along a direction substantially orthogonal to the surface of the piezoelectric layer, which is also normal to a direction of an electric field created by the interleaved fingers.

10. The acoustic resonator device of claim 1, wherein the cavity is in the intermediate layer.

11. The acoustic resonator device of claim 1, wherein the at least one metal layer comprises multiple layers of metal and dielectric material.

12. The acoustic resonator device of claim 1, wherein a perimeter of the gap has a different area than a perimeter of the cavity.

13. The acoustic resonator device of claim 1, wherein a thickness of the dielectric cover is between 12 percent and 60 percent of a thickness of the piezoelectric layer.

14. A method of fabricating radio frequency filters, the method comprising:
   forming a plurality of filter circuits on a surface of a wafer, each filter circuit comprising a plurality of transversely-excited film bulk acoustic resonators (XBARs) that each include a conductor pattern that includes an interdigital transducer (IDT) on a surface of a piezoelectric layer and that has interleaved fingers on a diaphragm of the piezoelectric layer;
   bonding a dielectric cover over the surface of the wafer to form a laminate, such that the dielectric cover forms an air gap above the IDT and the piezoelectric layer of at least one of the plurality of filter circuits, the dielectric cover including a bottom surface attached to a portion of the conductor pattern, and the conductor pattern including at least one metal layer that is attached to the dielectric cover; and
   dicing the laminate to provide individual filters.

15. A radio frequency filter comprising:
   a plurality of bulk acoustic wave resonators that each include:
      a substrate having a surface;
      a piezoelectric layer;
      a conductor pattern on a surface of the piezoelectric layer, the conductor pattern including an interdigital transducer (IDT) that includes interleaved fingers; and
      a dielectric cover over the interleaved fingers and the piezoelectric layer, the dielectric cover forming an air gap above the interleaved fingers of the IDT and the piezoelectric layer
      wherein the dielectric cover includes a bottom surface attached to a portion of the conductor pattern, and
      wherein the conductor pattern includes at least one metal layer that is attached to the dielectric cover.

16. The radio frequency filter of claim 15, wherein the plurality of bulk acoustic wave resonators includes a plurality of series resonators and a plurality of shunt resonators.

17. The radio frequency filter of claim 16, wherein the dielectric cover is configured to at least one of: a) reduce capacitive coupling between each of the plurality of series resonators and the plurality of shunt resonators, and b) reduce charges on a surface of the dielectric cover that act as a resistive layer.

18. The radio frequency filter of claim 15, wherein the dielectric cover of each of the plurality of bulk acoustic wave resonators is Quartz glass and has a height that is between 40 micrometers (μm) and 80 μm.

19. The radio frequency filter of claim 15, wherein a radio frequency signal applied to each IDT of the plurality of bulk acoustic wave resonators excites a primarily shear acoustic mode in the piezoelectric layer, such that acoustic energy propagates along a direction substantially orthogonal to the surface of the piezoelectric layer, which is also normal to a direction of an electric field created by the interleaved fingers of the respective bulk acoustic wave resonator.

20. The radio frequency filter of claim 15, wherein the conductor pattern comprises a plurality of metal layers including the at least one metal layer, wherein the IDT comprises a first set of metal layers and the at least one metal layer electrically connects the IDT to vias in the dielectric cover.

\* \* \* \* \*